United States Patent
Kim et al.

(10) Patent No.: US 9,805,818 B2
(45) Date of Patent: Oct. 31, 2017

(54) FUSE MEMORY HAVING DISCHARGE CIRCUIT

(71) Applicant: Samsung Electronics Co., Ltd., Suwon-si, Gyeonggi-do (KR)

(72) Inventors: Tae-seong Kim, Yongin-si (KR); Cheol-ha Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/354,304

(22) Filed: Nov. 17, 2016

(65) Prior Publication Data

US 2017/0221574 A1    Aug. 3, 2017

(51) Int. Cl.
*G11C 17/16* (2006.01)
*G11C 17/18* (2006.01)
*H01L 27/112* (2006.01)
*H01L 23/525* (2006.01)

(52) U.S. Cl.
CPC .............. *G11C 17/18* (2013.01); *G11C 17/16* (2013.01); *H01L 23/5256* (2013.01); *H01L 27/11206* (2013.01)

(58) Field of Classification Search
CPC ................................... G11C 17/16; G11C 8/12
USPC ............................................. 365/96, 230.03
See application file for complete search history.

(56) References Cited

U.S. PATENT DOCUMENTS

| | | | |
|---|---|---|---|
| 5,257,230 A * | 10/1993 | Nobori | G11C 29/785 257/E21.672 |
| 7,200,064 B1 | 4/2007 | Boerstler et al. | |
| 7,248,494 B2 | 7/2007 | Oh et al. | |
| 7,271,988 B2 | 9/2007 | Chung et al. | |
| 7,372,764 B2 | 5/2008 | Nautiyal et al. | |
| 7,586,787 B2 | 9/2009 | Vo et al. | |
| 8,400,860 B2 | 3/2013 | Lin et al. | |
| 8,542,549 B2 | 9/2013 | Lin et al. | |
| 8,767,433 B2 * | 7/2014 | Kurjanowicz | G11C 17/16 365/200 |
| 8,780,604 B2 | 7/2014 | Liao et al. | |
| 8,824,234 B2 | 9/2014 | Lin et al. | |
| 8,861,292 B2 * | 10/2014 | Sawada | G11C 17/18 365/200 |
| 9,543,309 B2 * | 1/2017 | Park | H01L 21/823437 |
| 9,589,663 B2 * | 3/2017 | Ha | G11C 17/18 |
| 9,595,529 B2 * | 3/2017 | Lee | H01L 27/11206 |
| 9,601,216 B2 * | 3/2017 | Ryu | G11C 29/76 |
| 2014/0104934 A1 | 4/2014 | McLaury | |

* cited by examiner

*Primary Examiner* — Michael Tran
(74) *Attorney, Agent, or Firm* — Harness, Dickey & Pierce, P.L.C.

(57) ABSTRACT

A fuse memory comprising a discharge circuit is provided. The fuse memory includes a fuse cell array comprising fuse cells connected to read word lines, programs word lines, and bit lines arranged in rows and columns; and at least one discharge circuit arranged in each of the rows. The discharge circuit discharges a voltage level of a program word line of the fuse cells selected in a read mode to a ground voltage.

19 Claims, 14 Drawing Sheets

FUSE MEMORY HAVING DISCHARGE CIRCUIT

CROSS-REFERENCE TO RELATED APPLICATION

This application claims the benefit of Korean Patent Application No. 10-2016-0010730, filed on Jan. 28, 2016, in the Korean Intellectual Property Office, the disclosure of which is incorporated herein in its entirety by reference.

BACKGROUND

Example embodiments of the inventive concepts relate to a semiconductor device. For example, at least some example embodiments relate to a fuse memory that secures a read margin by using a discharge circuit.

A fuse memory may store data having different logic levels according to a program state of a fuse. The fuse memory may be used in various devices. For example, when a defective memory cell is detected, a semiconductor memory device may perform a repair operation by replacing the defective memory cell with a redundant memory cell. The fuse memory may be used for the repair operation by storing a defective memory cell address, which is read during the repair operation. The semiconductor memory device may compare the read defective memory cell address with an address that is input to the semiconductor memory device, and, when the read defective memory cell address is the same as the input address, select the redundant memory cell. When the data stored in the fuse memory is read, a method of securing a read margin and performing a stable reading operation may be needed.

SUMMARY

Example embodiments of the inventive concepts provide a fuse memory having a discharge circuit for securing a read margin.

According to an example embodiment of the inventive concepts, a fuse memory may include a fuse cell array including fuse cells in rows and columns of the fuse cell array, each of the rows connected to a read word line and a programmed word line, and each of the columns connected to a bit line, each of the fuse cells including, a fuse device including a first terminal configured to receive a program voltage, a read transistor between a second terminal of the fuse device and the bit line of a respective one of the columns, the read transistor including a gate connected to the read word line of a respective one of the rows, and a program transistor between the second terminal of the fuse device and a ground voltage source, the program transistor including a gate connected to the programmed word line of the respective row; and at least one discharge circuit in each of the rows of the fuse cell array, the at least one discharge circuit configured to turn off the program transistor of one of the fuse cells, if the fuse cell is read.

According to another example embodiment of the inventive concepts, a fuse memory may include a fuse cell array including, fuse cells connected to read word lines and program word lines, and bit lines, the read word lines and the program word lines in rows of the fuse cell array, and the bit lines in columns of the fuse cell array, and a discharge circuit connected to the read word lines and the program word lines in each of the rows, the discharge circuit configured to discharge a voltage level of a selected one of the program word lines of the fuse cells to a ground voltage, if the fuse memory is operating in a read mode; a word line driver configured to selectively drive one of the read word lines and the program word lines of a selected one of the rows based on an operation mode; and a sense amplifier configured to generate a sensing output signal by sensing and amplifying data output from the fuse cells to the bit lines.

According to another example embodiment of the inventive concepts, a fuse memory may include at least one fuse cell including a fuse device having a first terminal and a second terminal, the first terminal connected in parallel between a read transistor and a program transistor, and the second terminal configured to receive a program voltage; and at least one discharge circuit configured to disconnect the first terminal from a ground voltage source, if the fuse memory is operating in a read mode.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
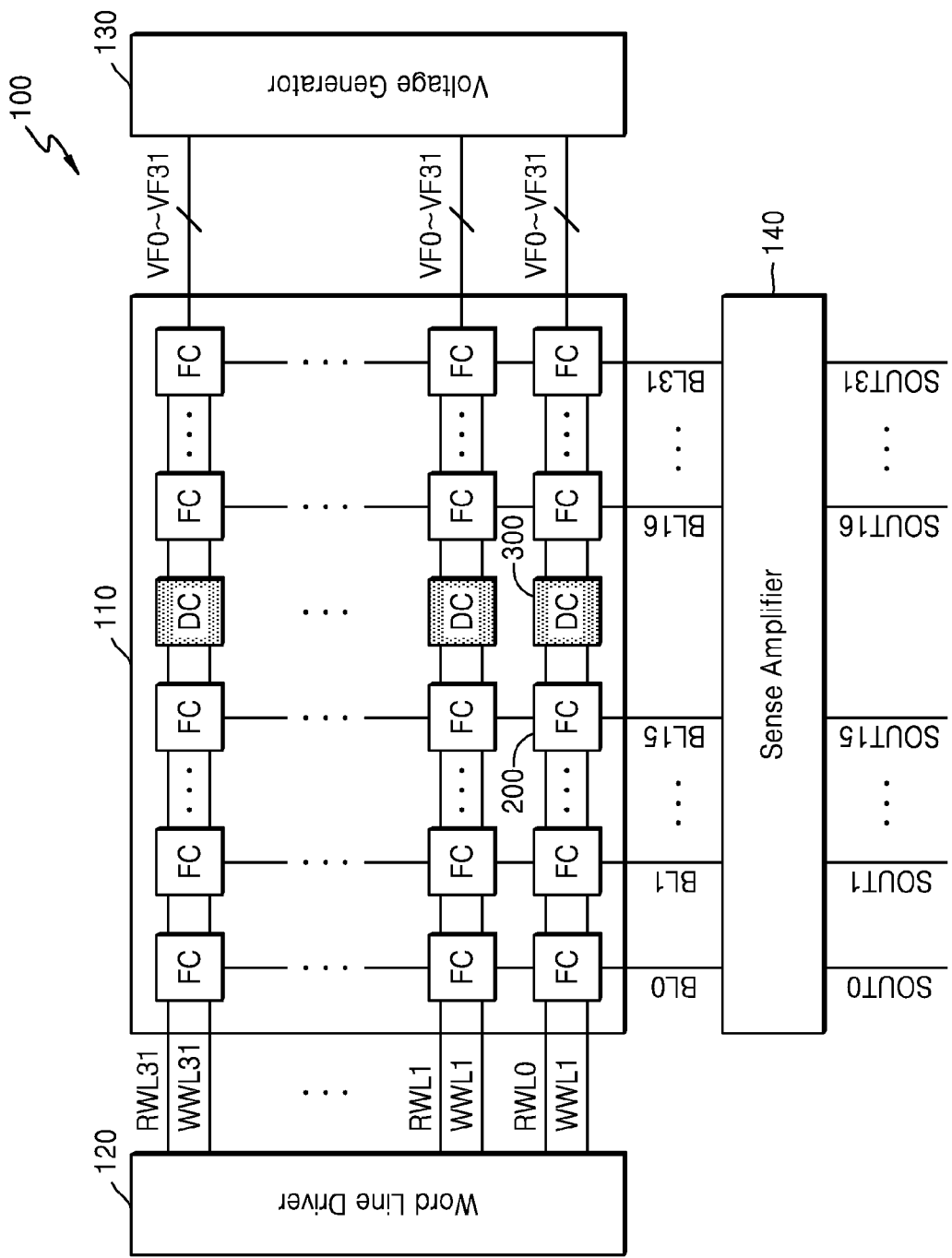
FIG. 1 is a block diagram for describing a fuse memory having a discharge circuit, according to an example embodiment.

Hereinafter, example embodiments of the inventive concepts will now be described more fully with reference to the accompanying drawings, in which some example embodiments of the inventive concepts are shown. Like reference numerals in the drawings denote like elements, and a repeated explanation will not be given of overlapping features. As used herein, the term "and/or" includes any and all combinations of one or more of the associated listed items.

These inventive concepts may, however, be embodied in different forms and should not be construed as limited to the example embodiments set forth herein. Rather, these example embodiments are provided so that this disclosure is thorough and complete and fully conveys the inventive concepts to those of ordinary skill in the art. It should be understood that example embodiments of the inventive concepts are to cover all modifications, equivalents, and alternatives falling within the spirit and scope of the inventive concepts. In the attached drawings, sizes of structures may be exaggerated for clarity.

The terminology used herein is for describing particular example embodiments and is not intended to be limiting of example embodiments. As used herein, the singular forms "a," "an," and "the," are intended to include the plural forms as well, unless the context clearly displays otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood in the art to which the embodiments belong. It will be further understood that the terms such as those defined in commonly used dictionaries should be interpreted as having meanings consistent with their meanings in the context of the relevant art and will not be interpreted in an idealized or overly formal sense unless expressly so defined herein.

FIG. 1 is a block diagram for describing a fuse memory 100 having a discharge circuit, according to an example embodiment.

Referring to FIG. 1, the fuse memory 100 may include a fuse cell array 110, a word line driver 120, a voltage generator 130, and a sense amplifier 140.

The fuse cell array 110 may include a plurality of fuse cells FC arranged in rows and columns.

In some example embodiments, the fuse cells FC may include an electrical fuse (hereinafter referred to as an "E-fuse") whose connection is controlled by an electrical signal. The E-fuse may have a characteristic in which its state changes from a low resistance to a high resistance according to application of a high voltage. The E-fuse may be configured as a metal conductive layer pattern.

According to an example embodiment, the fuse cells FC may include an anti-fuse implemented by inserting a dielectric substance between conductors. The anti-fuse may be a metal-oxide semiconductor (MOS) transistor. The anti-fuse may have a characteristic in which its state changes from a high resistance to a low resistance according to application of a high voltage. The anti-fuse may have an electrical characteristic opposite to that of the E-fuse.

According to another example embodiment, the fuse cells FC may include a laser fuse having a characteristic in which its connection is controlled by irradiating a laser beam and its state changes from a low resistance to a high resistance according to application of a high voltage.

The fuse cell array 110 may have an array structure in which the fuse cells FC are arranged at locations where a plurality of rows and a plurality of columns cross each other. For example, when the fuse cell array 110 has 32 rows and 32 columns, a 1K bit array including 1K fuse cells FC may be configured. According to an example embodiment, the fuse cell array 110 may be variously configured as an m*n bit array in which the fuse cells FC are arranged in m rows and n columns.

The fuse cell array 110 may be connected to 32 word line pairs (RWL0, WWL0)~(RWL31, WWL31) to access the fuse cells FC arranged in 32 rows. Read word lines RWL, and program word lines WWL may be connected in pairs in each row of the fuse cell array 110. The fuse cell array 110 may be connected to 32 bit lines 13L0~BL31 to transfer data read from the fuse cells FC arranged in 32 columns.

Figure 2:
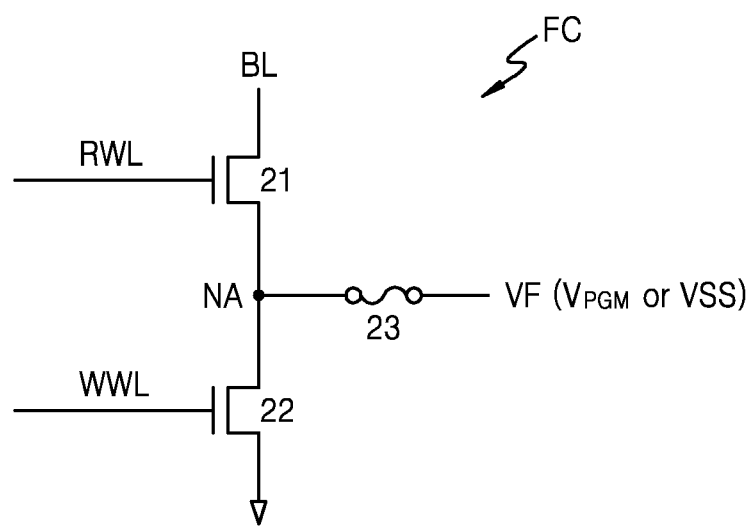
FIG. 2 is a circuit diagram for describing a fuse cell included in a fuse cell array of FIG. 1.

FIG. 2 is a circuit diagram for describing a fuse cell included in a fuse cell array of FIG. 1.

Referring to FIGS. 1 and 2, a fuse cell FC of the fuse cell array 110, as shown in FIG. 2, may include a read transistor 21, a program transistor 22, and a fuse element 23.

The read transistor 21 may be connected between a bit line BL and a first node NA. The read word line RWL may be connected to a gate of the read transistor 21. The program transistor 22 may be connected between the first node NA and a ground voltage VSS source. The program word line WWL may be connected to a gate of the program transistor 22. The fuse element 23 may be connected between the first node NA and a control voltage VF source, a control voltage VF being provided by a voltage generator 130 of FIG. 1. The fuse element 23 may be implemented as an E-fuse or an anti-fuse. In the present embodiment, the fuse element 23 is described as the E-fuse.

The fuse memory 100 of FIG. 1 may operate in two modes. A first operation mode may be a program mode. A second operation mode may be a read mode. In the program mode, the control voltage VF applied to the E-fuse 23 may be provided as a high program voltage VPGM and may be programmed to cut the E-fuse 23. In the read mode, the control voltage FV of the E-fuse 23 may be provided as the ground voltage VSS.

In the program mode, the read word line RWL of the fuse cell FC may be inactivated, the program word line WWL may be activated, and the program voltage VPGM may be applied as the control voltage VF to the E-fuse 23. Accordingly, the E-fuse 23 may be cut by current that flows through the program voltage VPGM, the E-fuse 23, the program transistor 22, and the ground voltage source VSS. The cut E-fuse 23 may have a high resistance value and data may be programmed. It is assumed that the cut E-fuse 23 stores, for example, data '1', and the un-programmed E-fuse 23 stores data '0'.

In the read mode, the program word line WWL of the fuse cell FC may be inactivated, the read word line RWL may be activated, and the control voltage VF of the E-fuse 23 may be applied to the ground voltage VSS. Accordingly, a path of current that flows through a bit line BL, the read transistor 21, and the E-fuse 23 may be formed. In this regard, a voltage level of the bit line BL may be differently output according to whether the programmed E-fuse 23 is cut. That is, the data of the fuse cell FC may be read.

For example, when the E-fuse 23 is not programmed, the bit line BL may be output as a level of the ground voltage VSS source by a path of current that flows through the bit line BL, the read transistor 21, the E-fuse 23, and the ground voltage VSS source. Accordingly, the fuse cell FC may be read as the data '0'.

When the E-fuse 23 is cut, the bit line BL may be output as a voltage level higher than a certain reference voltage by a high resistance value due to the cut E-fuse 23 in the path of the current that flows through the bit line BL, the read transistor 21, the E-fuse 23, and the ground voltage VSS. Accordingly, the fuse cell FC may be read as the data '1'.

In FIG. 1, the fuse cell array 110 may include at least one discharge circuit DC for each of the 32 rows. The discharge circuit DC may be disposed in a center of the fuse cell array 110. According to an example embodiment, the discharge circuit DC may be disposed at an edge of the fuse cell array 110, for example, an edge of the fuse cell array 110 at a farthest distance from the word line driver 120.

Figure 4A:
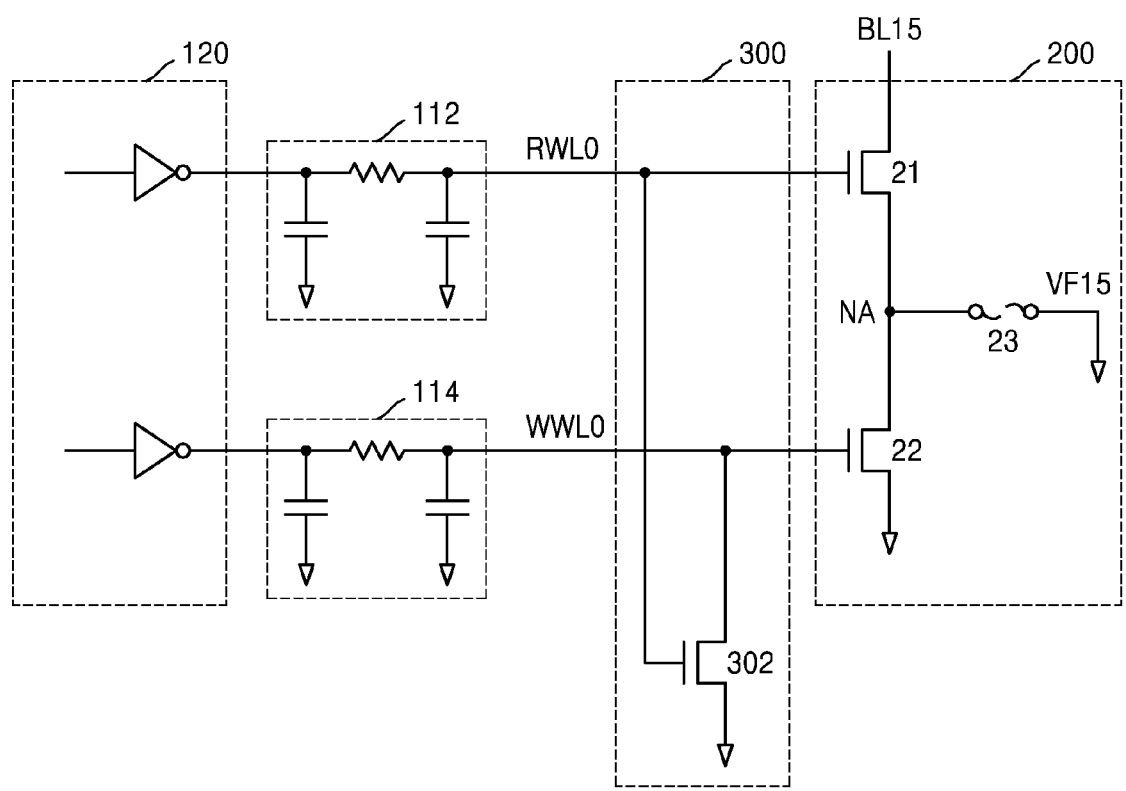
FIGS. 4A and 4B are diagrams for describing a read margin increase of the fuse cell included in the fuse cell array of FIG. 1.

Each discharge circuit DC may be configured as an NMOS transistor 302 of FIG. 4A that is connected between the program word line WWL of a fuse cell FC connected to a row selected from among the rows of the fuse cell array 110 and the ground voltage VSS source and has the read word line RWL connected to a gate of the NMOS transistor.

The discharge circuit DC may discharge a voltage level of the program word line WWL by the read word line RWL activated in the read mode to the ground voltage VSS, thereby blocking a leakage current due to a program transistor 22 of FIG. 4A. Accordingly, the discharge circuit DC may stably operate when reading the data '1' stored in the fuse cell FC.

The word line driver 120 may apply a driving voltage so as to activate the read word lines RWL0~RWL31 and the program word lines WWL0~WWL31 of a row selected from among the 32 rows of the fuse cell array 110. In the read mode, the word line driver 120 may apply the driving voltage to the read word line RWL of the selected row to activate the read word line RWL and may apply the ground voltage VSS to the program word line WWL of the selected row to inactivate the program word line WWL. In the program mode, the word line driver 120 may apply the driving voltage to the program word line WWL to activate the program word line WWL and may apply the ground voltage VSS to the read word line RWL of the selected row to inactivate the read word line RWL.

The voltage generator 130 may provide the control voltage VF to each of the E-fuses 23 of FIG. 2 of the fuse cells FC connected to the selected row among the 32 rows of the fuse cell array 110. In the present example embodiment, since the 32 fuse cells FC may be connected to one row, the voltage generator 130 may provide control voltages VF0~VF31 to respectively the E-fuses 23 of the 32 fuse cells FC. The voltage generator 130 may apply the ground voltage VSS to the control voltage VF of the E-fuse 23 in the read mode and may apply the program voltage VPGM to the E-fuse 23 of the fuse cell FC programmed in the program mode.

The sense amplifier 140 may sense and amplify data output from bit lines BL0~BL31 of the fuse cells FC connected to the selected row of the fuse cell array 110. The sense amplifier 140 may compare a voltage level of each of the bit lines BL0~BL31 with at least one reference voltage REF of FIGS. 3B and 4B to output sensing output signals SOUT0~SOUT31.

Figure 3A:
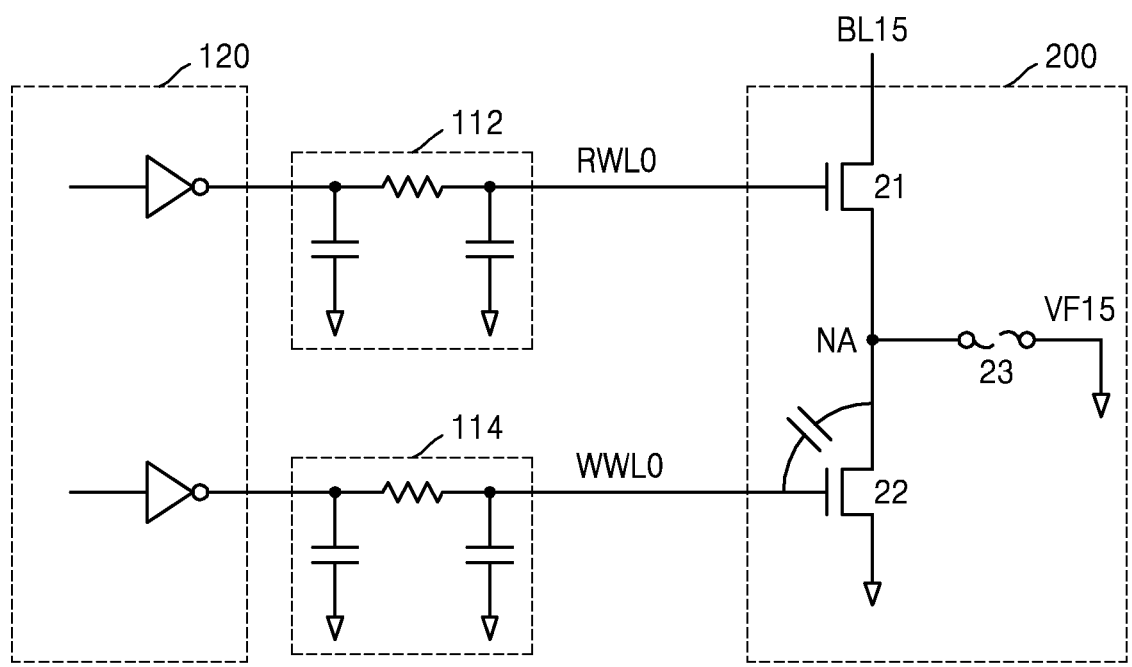
FIGS. 3A and 3B are diagrams for describing a read margin reduction of the fuse cell included in the fuse cell array of FIG. 1.
Figure 3B:
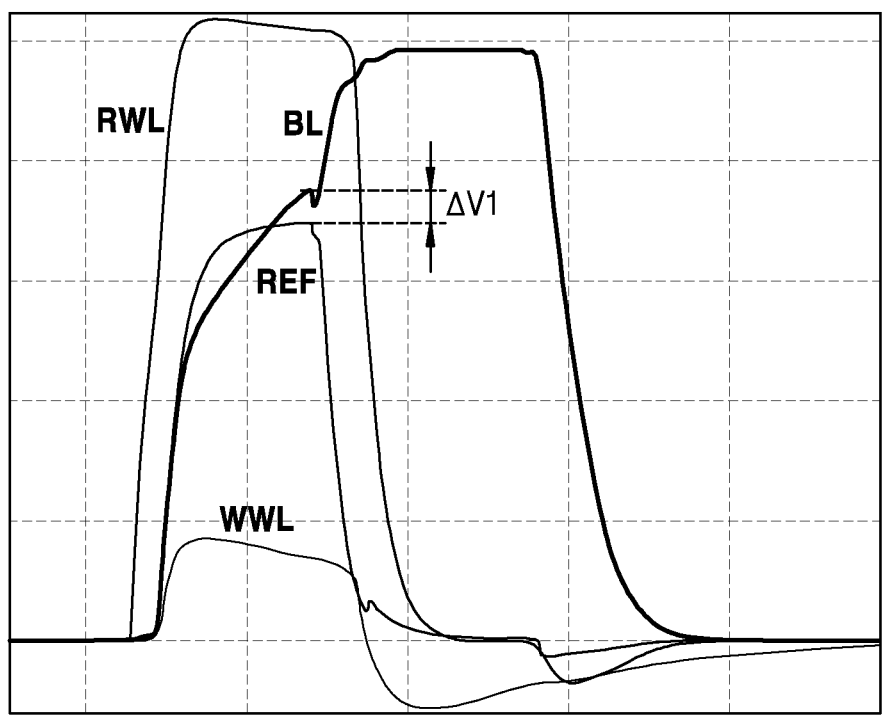

FIGS. 3A and 3B are diagrams for describing a read margin reduction of a fuse cell 200 included in the fuse cell array 110 of FIG. 1. FIG. 3A is a circuit diagram of modeling a connection relationship of the fuse cell 200 connected to a first row in the fuse cell array 110 of FIG. 1. FIG. 3B is a waveform describing a read operation of a modeling circuit of FIG. 3A.

Referring to FIG. 3A, the fuse cell 200 may be connected to the first read word line RWL0 and the first program word line WWL0 that are driven by the word line driver 120. The first read word line RWL0 may be connected to a first load circuit 112 modeling load components provided on the first read word line RWL0. The first load circuit 112 may be regarded as modeling line resistance and line capacitance components caused by a physical distance between the word line driver 120 and the read transistor 21 of the fuse cell 200.

The first program word line WWL0 may be connected to a second load circuit 114 modeling load components provided on the first program word line WWL0. The second load circuit 114 may be regarded as modeling line resistance and line capacitance components caused by a physical distance between the word line driver 120 and the program transistor 22 of the fuse cell 200.

Lengths of the first read word line RWL0 and the first program word line WWL0 may be relatively large because of a relatively large quantity of the fuse cell array 110 of FIG. 1 and a semiconductor refining process, and thus resistance components of the first and second load circuits 112 and 114 may be relatively large.

In the read mode, the first read word line RWL0 may be activated, the first program word line WWL0 may be inactivated by application of the ground voltage VSS, and a control voltage VF15 may be applied as the ground voltage VSS. When the fuse cell 200 is in a program state, current may flow in the bit line BL through the read transistor 21, and a voltage of the first node NA of the fuse cell 200 may increase due to the cut E-fuse 23.

The increased voltage of the first node NA may be coupled to the first program word line WWL0 to increase a voltage level of the first program word line WWL0. Although the ground voltage VSS is applied to the first program word line WWL0 by the word line driver 120, a driving capability of the word line driver 120 may be relatively reduced by the second load circuit 114. Accordingly, it may be understood that the first program word line WWL0 is coupled to the voltage of the first node NA.

If the voltage level of the first program word line WWL0 increases, a leakage current may occur through the program transistor 22 and the ground voltage VSS source. Accordingly, the voltage level of the first node NA may be reduced by the leakage current of the program transistor 22. Since the voltage level of the first node NA is reduced, a voltage level of the bit line BL may also be reduced.

As shown in FIG. 3B, the voltage level of the first program word line WWL0 increases owing to coupling, and a read margin ΔV1 between the voltage level of the bit line BL and the reference voltage REF may be reduced.

Figure 4B:
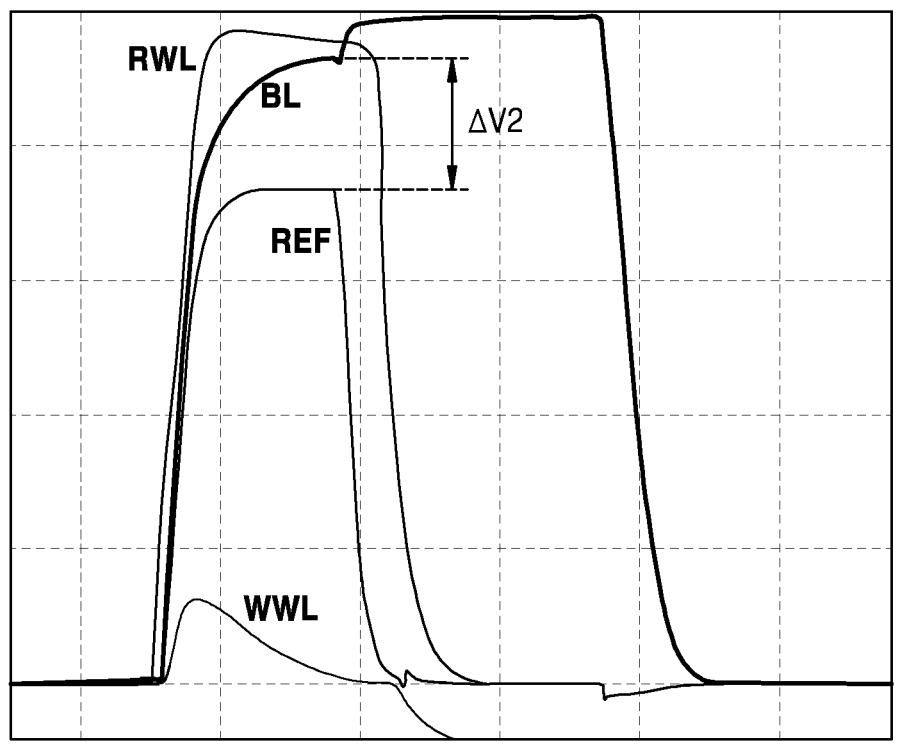

FIGS. 4A and 4B are diagrams for describing a read margin increase of the fuse cell 200 included in the fuse cell array 110 of FIG. 1. FIG. 4A is a circuit diagram of a discharge circuit 300 that operates by being linked to a modeling circuit of FIG. 3A. FIG. 4B is a waveform describing a read operation of the discharge circuit 300 of FIG. 4A.

Referring to FIG. 4A, the discharge circuit 300 may be connected between the first read word line RWL0 and the first program word line WWL0 in the modeling circuit of FIG. 3A. The discharge circuit 300 may include an NMOS transistor 302 that is connected between the first program word line WWL0 and the ground voltage VSS source and has a gate connected to the first read word line RWL0.

As discussed in more detail below, the NMOS transistor 302 of the discharge circuit 300 may increase the reduced read margin ΔV1 shown in FIGS. 3A and 3B.

In the read mode, the first read word line RWL0 may be activated, the first program word line WWL0 may be inactivated by application of the ground voltage VSS, and the control voltage VF15 may be applied as the ground voltage VSS. When the fuse cell 200 is in a program state, current may flow in the bit line BL through the read transistor 21, and a voltage of the first node NA of the fuse cell 200 may increase due to the cut E-fuse 23.

In this regard, the NMOS transistor 302 connected to the activated first read word line RWL0 may be turned on so that the first program word line WWL0 may be at a level of the ground voltage VSS. The program transistor 22 connected to the first program word line WWL0 of the ground voltage VSS may be turned off so that a leakage current between the first node NA and the ground voltage VSS source may be blocked.

As shown in FIG. 4B, a voltage level of the first program word line WWL0 may be set as the ground voltage VSS by the NMOS transistor 302 of the discharge circuit 300, and thus a read margin ΔV2 between a voltage level of the bit line BL and the reference voltage REF may increase.

Figure 5:
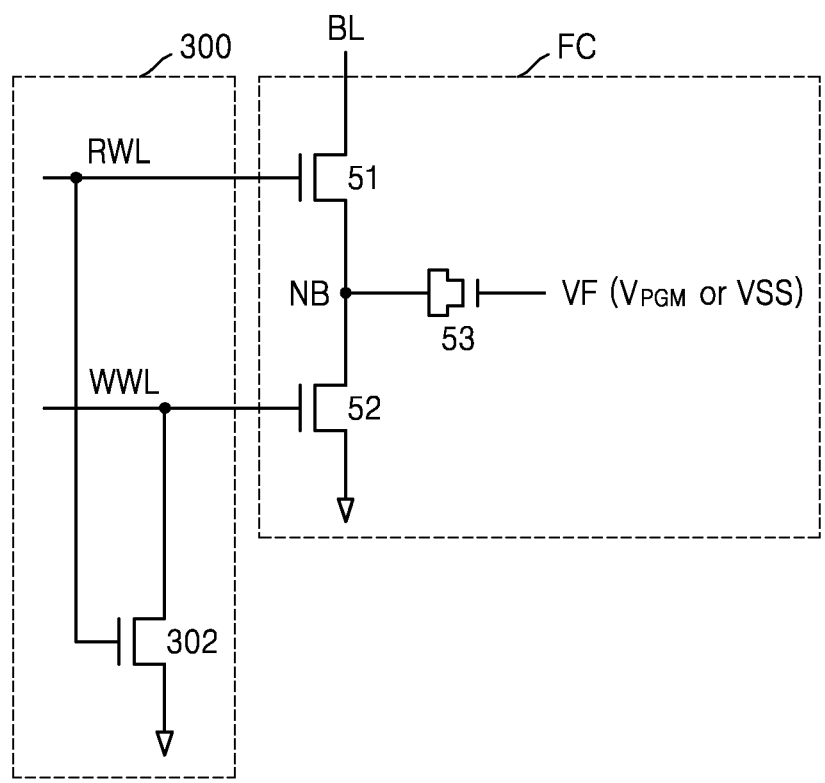
FIG. 5 is a diagram for describing a fuse cell connected to a discharge circuit, according to an example embodiment.

FIG. 5 is a diagram for describing the fuse cell FC connected to the discharge circuit 300 according to an example embodiment.

Referring to FIG. 5, the fuse cell FC may be disposed in the fuse cell array 110 of FIG. 1, and may include a read transistor 51 connected to the read word line RWL, a program transistor 52 connected to the program word line WWL, and an anti-fuse 53. The discharge circuit 300 may include the NMOS transistor 302 that is connected between the program word line WWL and the ground voltage VSS and has a gate connected to the read word line RWL.

The read transistor 51 may be connected between the bit line BL and a second node NB. The read word line RWL may be connected to a gate of the read transistor 51. The program transistor 52 may be connected between the second node NB and the ground voltage VSS. The program word line WWL may be connected to a gate of the program transistor 52. The anti-fuse 53 may be connected between the second node NB and the control voltage VF provided from the voltage generator 130 of FIG. 1.

In the program mode, the control voltage VF of the anti-fuse 53 may be provided as the program voltage VPGM. If the read word line RWL of the fuse cell FC is inactivated, and the program word line WWL is activated, since a dielectric substance included in the anti-fuse 53 may be destroyed due to current that flows through the program voltage VPGM, the anti-fuse 53, the program transistor 52, and the ground voltage VSS, the anti-fuse 53 may be programmed to be cut, it is assumed that the cut anti-fuse 53 stores, for example, data '0', and the un-programmed anti-fuse 53 stores data '1'.

In the read mode, the program word line WWL of the fuse cell FC may be inactivated, the read word line RWL may be activated, and the control voltage VF of the anti-fuse 53 may be applied to the ground voltage VSS. Accordingly, a path of current that flows through the bit line BL, the read transistor 51, and the anti-fuse 53 may be formed. In this regard, a voltage level of the bit line BL may be differently output according to whether the programmed anti-fuse 53 is cut. That is, data of the fuse cell FC may be read.

For example, when the anti-fuse 53 is programmed, the bit line BL may be output as a level of the ground voltage VSS by a path of current that flows the bit line BL, the read transistor 51, the shot-circuited anti-fuse 53, and the ground voltage VSS. Accordingly, the fuse cell FC may be read as the data '0'.

When the anti-fuse 53 is not programmed, the bit line BL may be output as a voltage level higher than a certain reference voltage by a high resistance value due to the anti-fuse 53 in the path of the current that flows through the bit line BL, the read transistor 51, the anti-fuse 53, and the ground voltage VSS.

The NMOS transistor 302 of the discharge circuit 300 connected to the activated read word line RWL may be turned on, and thus the program word line WWL may be a level of the ground voltage VSS. The program transistor 52 connected to the program word line WWL of the ground voltage VSS may be turned off, and thus a leakage current between the second node NB and the ground voltage VSS may be blocked. Accordingly, the fuse cell FC may be stably read as the data '1'.

Figure 6:
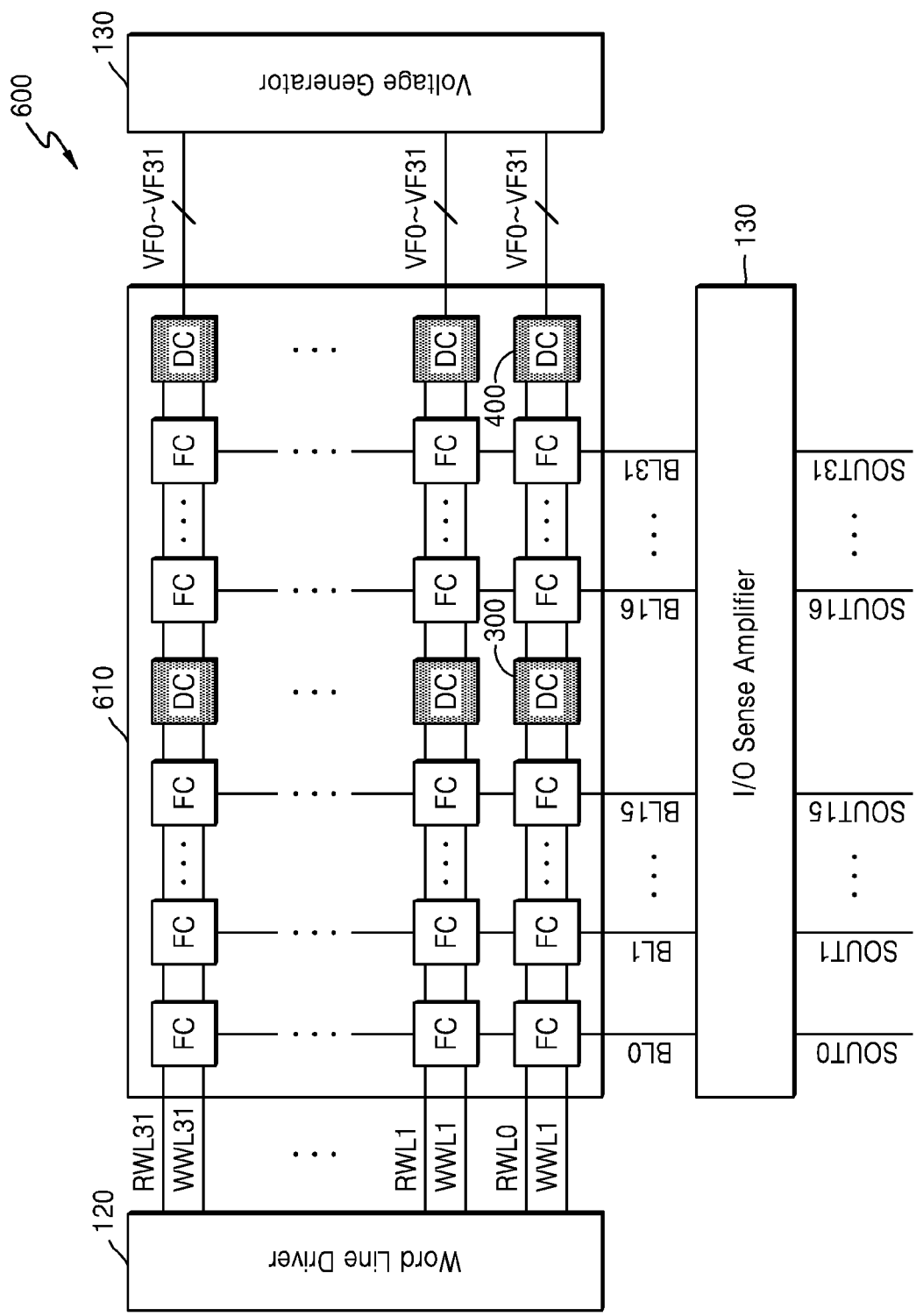
FIG. 6 is a block diagram for describing a fuse memory having discharge circuits, according to example embodiments.

FIG. 6 is a block diagram for describing a fuse memory 600 having discharge circuits 300 and 400 according to embodiments.

Referring to FIG. 6, the fuse memory 600 is different from the fuse memory 100 of FIG. 1 in that two discharge circuits, namely, the discharge circuits 300 and 400, are disposed in each row in a fuse cell array 610.

The first discharge circuit 300 may be disposed in a center of the fuse cell array 610. The second discharge circuit 400 may be disposed in an edge of the fuse cell array 610 that is the farthest distance from the word line driver 120. However, example embodiments are not limited thereto. For example, according to an example embodiment, the fuse memory 600 may include more or less than two of discharge circuits in the fuse cell array 610.

Each of the first and second discharge circuits 300 and 400, as described with reference to FIG. 4A, may be configured as the NMOS transistor 302 of FIG. 4A that is connected between the program word line WWL of the fuse cell FC connected to a row selected among rows included in the fuse cell array 610 and the ground voltage VSS and has a gate connected to the read word line RWL.

The fuse memory 600 may turn on the NMOS transistor 302 of the first and second discharge circuits 300 and 400 connected to the read word line RWL activated in a read mode so that the program word line WWL is further stably set at a level of the ground voltage VSS. A program transistor connected to the program word line WWL of the ground voltage VSS may be turned off, and thus a leakage current between the second node NB and the ground voltage VSS may be blocked. Accordingly, the fuse memory 600 may stably read the data '1' stored in the fuse cell FC.

Figure 7:
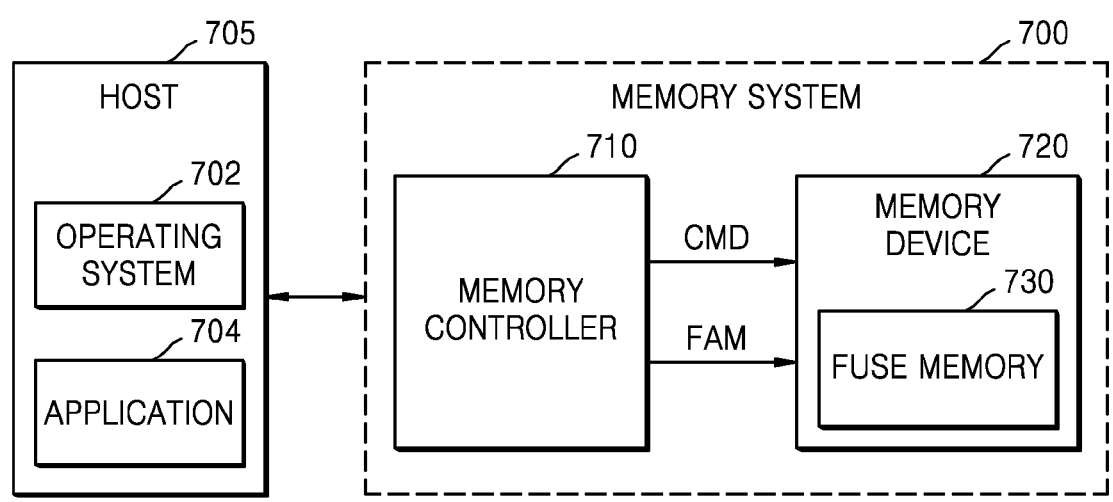
FIG. 7 is a diagram for describing a memory system including a fuse memory having a discharge circuit, according to example embodiments.

FIG. 7 is a diagram for describing a memory system 700 including a fuse memory 730 having a discharge circuit according to example embodiments.

Referring to FIG. 7, the memory system 700 may perform a write operation or a read operation according to an I/O request of a host 705. The memory system 700 may include a memory controller 710 and a memory device 720.

The host 705 may include electronic devices such as a computer, a laptop computer, a smart phone, a smart pad, a smart TV, a net book, etc.

The host 705 may include a memory and a processor, the processor may execute instructions stored in the memory that configure the processor to run an application 704 under an operating system 702 to access the memory system 700.

The memory system 700 may receive a command CMD of the host 705 and a defective address FAM of the memory device 720. The memory device 720 may store the defective address FAM in the fuse memory 730.

The fuse memory 730 may include a fuse cell array in which a plurality of fuse cells and are arranged in multiple rows and multiple columns. Each fuse cell may include a read transistor connected to a read word line, a program transistor connected to a program word line, and a fuse device connected to a connection node between the read transistor and the program transistor. The fuse device may be implemented as an e-fuse or an anti-fuse and may be selectively programmed.

According to example embodiments, the fuse memory 730 may include at least one discharge circuit in each row included in the fuse cell array. The discharge circuit may turn off the program transistor connected to the program word line, and, therefore, may block a leakage current of the program transistor in a read mode. Accordingly, the fuse memory 730 may secure a read margin with respect to data stored in the fuse cell according to whether the fuse device is programmed, thereby stably reading the data.

Figure 8:
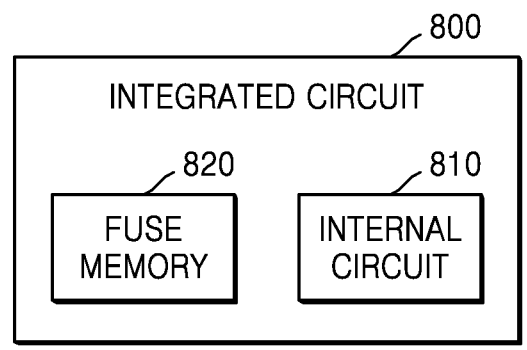
FIG. 8 is a block diagram of an integrated circuit including a fuse memory having a discharge circuit, according to example embodiments.

FIG. 8 is a block diagram of an integrated circuit 800 including a fuse memory 820 having a discharge circuit according to example embodiments.

Referring to FIG. 8, the integrated circuit 800 may include an internal circuit 810 and the fuse memory 820.

The internal circuit 810 may perform a specific operation of the integrated circuit 800. The fuse memory 820 may store information used to set an operation environment of the internal circuit 810. The fuse memory 820 may include a fuse cell array in which a plurality of fuse cells are arranged in multiple rows and multiple columns. Each fuse cell may include a read transistor connected to a read word line, a program transistor connected to a program word line, and a fuse device that is connected to a connection node between the read transistor and the program transistor and is selectively programmed.

The fuse memory 820 may include at least one discharge circuit in each row included in the fuse cell array. The discharge circuit may turn off the program transistor connected to the program word line, and, thus, may block a leakage current of the program transistor in a read mode. The fuse memory 820 may secure a read margin with respect to data stored in the fuse cell according to whether the fuse device is programmed, thereby stably reading the data. Accordingly, the internal circuit 810 may stably perform the specific operation.

Figure 9:
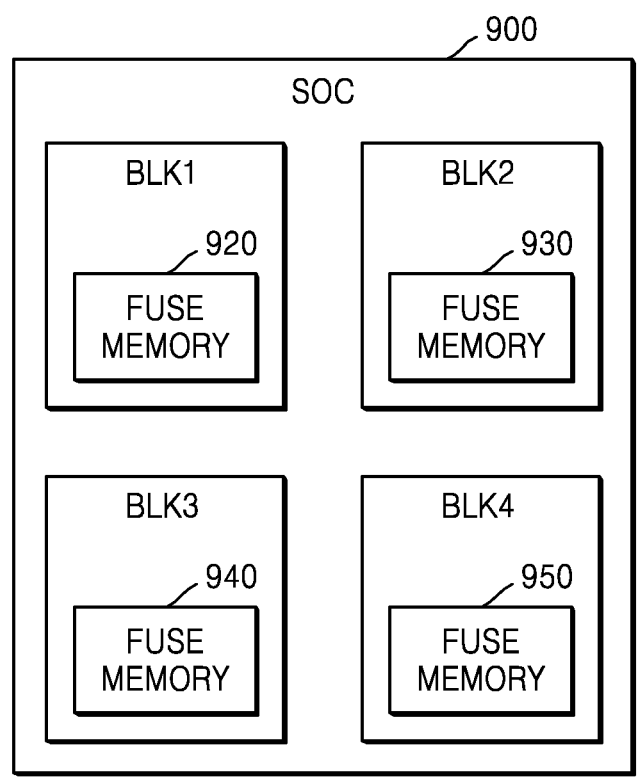
FIG. 9 is a block diagram of a system on chip including fuse memories each having a discharge circuit, according to example embodiments.

FIG. 9 is a block diagram of a system on chip (SoC) 900 including fuse memories 920, 930, 940, and 950 each having a discharge circuit according to example embodiments.

Referring to FIG. 9, the SoC 900 may include a plurality of blocks BLK1, BLK2, BLK3, and BLK4 that may be identified by respective unique functions. Each of the blocks BLK1, BLK2, BLK3, and BLK4 may be one or more of a core block including a processor, a memory controller, etc., a display control block, a file system block, a graphic processing unit (GPU) block, an image signal processing block, and a multi-format codec block.

According to an example embodiment, the SoC 900 may be an application processor (AP), a microprocessor, a central processing unit (CPU), an application specific integrated circuit (ASCI), a mobile SoC, a multimedia SoC, and/or a device or a system similar to these.

The blocks BLK1, BLK2, BLK3, and BLK4 may respectively include the fuse memories 920, 930, 940, and 950. The fuse memories 920, 930, 940, and 950 may respectively store information relating to an operation environment of the blocks BLK1, BLK2, BLK3, and BLK4.

Each of the fuse memories 920, 930, 940, and 950 may include a fuse cell array in which a plurality of fuse cells are arranged in multiple rows and multiple columns. Each fuse cell may include a read transistor connected to a read word line, a program transistor connected to a program word line, and a fuse device that is connected to a connection node between the read transistor and the program transistor and is selectively programmed.

Each of the fuse memories 920, 930, 940, and 950 may include at least one discharge circuit in each row included in the fuse cell array. The discharge circuit may turn off the program transistor connected to the program word line, and, thus may block a leakage current of the program transistor in a read mode. Each of the fuse memories 920, 930, 940, and 950 may secure a read margin with respect to data stored in the fuse cell according to whether the fuse device is programmed, thereby stably reading the data. Accordingly, the blocks BLK1, BLK2, BLK3, and BLK4 of the SoC 900 may stably perform the unique functions.

Figure 10:
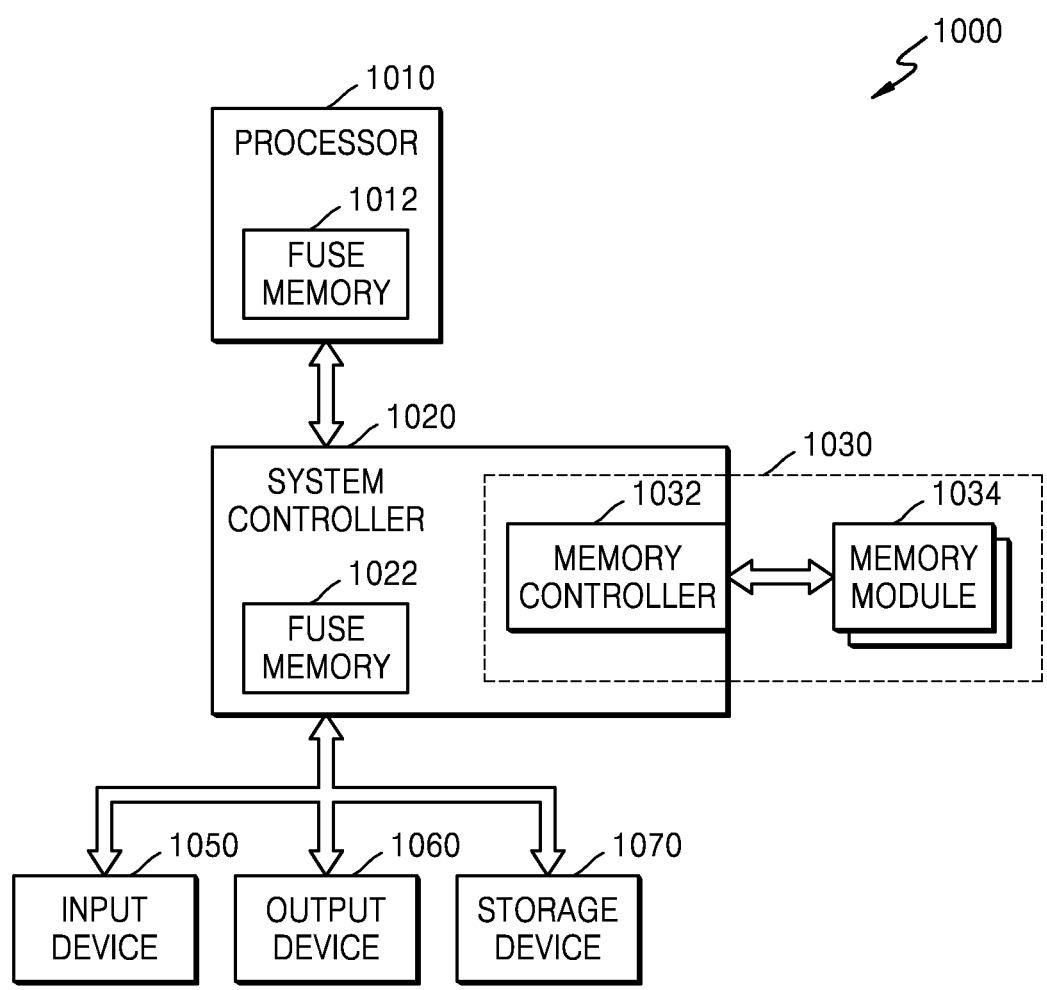
FIG. 10 is a block diagram of a memory system including fuse memories each having a discharge circuit, according to example embodiments.

FIG. 10 is a block diagram of a memory system 1000 including fuse memories 1012 and 1022 each having a discharge circuit according to example embodiments.

Referring to FIG. 10, the memory system 1000 may include a processor 1010, a system controller 1020, and a memory device 1030. The memory system 1000 may further include an input device 1050, an output device 1060, and a storage device 1070.

The memory device 1030 may include a plurality of memory modules 1034 and a memory controller 1032 for controlling the memory modules 1034. The memory modules 1034 may include at least one volatile memory or nonvolatile memory. The memory controller 1032 may be included in the system controller 1020.

The processor 1010 may execute instructions, which configure the processor as a special purpose computer to perform specific calculations or tasks. The processor 1010 may be connected to the system controller 1020 via a processor bus. The system controller 1020 may be connected to the input device 1050, the output device 1060, and the storage device 1070 through an extension bus. Accordingly, the processor 1010 may control the input device 1050, the output device 1060, and the storage device 1070 through the system controller 1020.

The processor 1010 and the system controller 1020 may include the fuse memories 1012 and 1022. The fuse memories 1012 and 1022 may store information regarding an operation environment of the processor 1010 and the system controller 1020.

Each of the fuse memories 1012 and 1022 may include a fuse cell array in which a plurality of fuse cells are arranged in multiple rows and multiple columns. Each fuse cell may include a read transistor connected to a read word line, a program transistor connected to a program word line, and a fuse device that is connected to a connection node between the read transistor and the program transistor and is selectively programmed.

Each of the fuse memories 1012 and 1022 may include at least one discharge circuit in each row included in the fuse cell array. The discharge circuit may turn off the program transistor connected to the program word line, and, thus may block a leakage current of the program transistor in a read mode. Each of the fuse memories 1012 and 1022 may secure a read margin with respect to data stored in the fuse cell according to whether the fuse device is programmed, thereby stably reading the data. Accordingly, the processor 1010 and the system controller 1020 of the memory system 1000 may stably perform the specific calculations or tasks.

Figure 11:
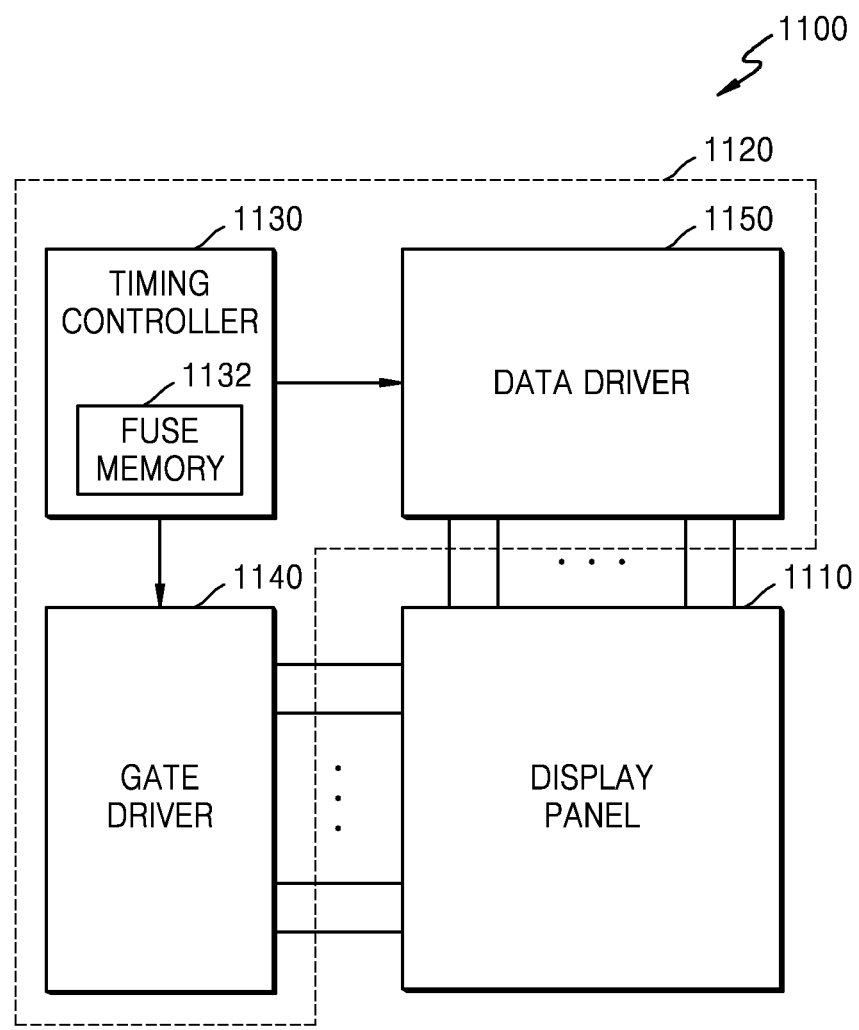
FIG. 11 is a block diagram of a display system including a fuse memory having a discharge circuit, according to example embodiments.

FIG. 11 is a block diagram of a display system 1100 including a fuse memory 1132 having a discharge circuit according to embodiments.

Referring to FIG. 11, the display system 1100 may include a display panel 1110 and a display driver integrated circuit (DDI) 1120.

The display panel 1110 may include a plurality of gate lines and a plurality of data lines and may include a plurality of pixels defined in regions where each gate line and each data line cross each other. The plurality of pixels may be arranged in a matrix shape to form a pixel array. The display panel 1110 may include an LCD panel, an LED panel, an OLED panel, a FED panel, etc.

The DDI 1120 may control driving of the display panel 1110, The DDI 1120 may include a timing controller 1130, a gate driver 1140, and a data driver 1150.

The timing controller 1130 may generate a gate driver control signal, a data driver control signal, and data based on an image data signal and a system control signal received from an external device such as a GPU.

The gate driver 1140 may selectively activate the gate lines of the display panel 1110 based on the gate driver control signal to select a row of the pixel array.

The data driver 1150 may apply a plurality of driving voltages to the data lines of the display panel 1110 based on the data driver control signal and the data. The display panel 1110 may be driven by operations of the gate driver 1140 and the data driver 1150 and may display an image corresponding to the image data signal.

The timing controller 1130 may include the fuse memory 132 storing information relating to an operation environment of the display system 1100. The fuse memory 1132 may include a fuse cell array in which a plurality of fuse cells are arranged in multiple rows and multiple columns. Each fuse cell may include a read transistor connected to a read word line, a program transistor connected to a program word line, and a fuse device that is connected to a connection node between the read transistor and the program transistor and is selectively programmed.

The fuse memory 1132 may include at least one discharge circuit in each row included in the fuse cell array. The discharge circuit may turn off the program transistor connected to the program word line and, thus, may block a leakage current of the program transistor in a read mode. The fuse memory 1132 may secure a read margin with respect to data stored in the fuse cell according to whether the fuse device is programmed, thereby stably reading the data. Accordingly, the timing controller 1130 may stably generate the gate driver control signal, the data driver control signal, and the data.

Figure 12:
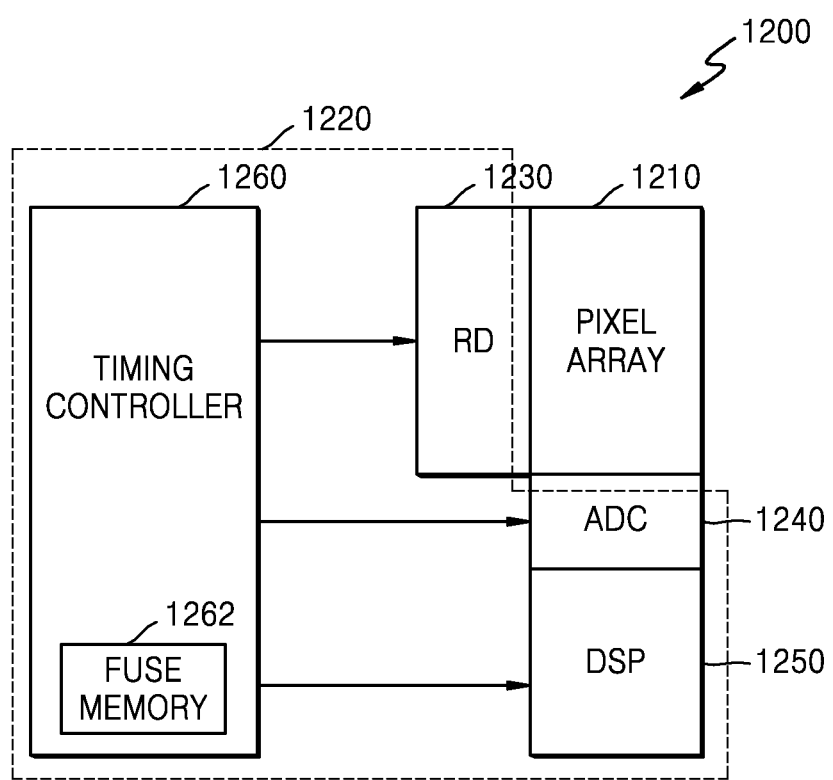
FIG. 12 is a block diagram of an image sensor including a fuse memory having a discharge circuit, according to example embodiments.

FIG. 12 is a block diagram of an image sensor 1200 including a fuse memory 1262 having a discharge circuit according to embodiments.

Referring to FIG. 12, the image sensor 1200 may include a pixel array 1210 and a signal processor 1220.

The pixel array 1210 may convert an incident light and generate an electrical signal. The pixel array 1210 may include a plurality of unit pixels arranged in a matrix shape. The plurality of unit pixels may include color pixels providing color image information and/or distance pixels providing distance information to a subject (not shown). When the pixel array 1210 includes the distance pixels, the image sensor 1200 may further include a light source unit irradiating light to the subject.

The signal processor 1220 may process the electrical signal and generate image data. The signal processor 1220 may include a row driver (RD) 1230, an analog digital converter (ADC) 1240, a digital signal processor (DSP) 1250, and a timing controller 1260.

The RD 1230 may be connected to each row of the pixel array 1210 and may generate a driving signal driving each row. The ADC 1240 may be connected to each column of the pixel array 1210 and may convert an analog signal output from the pixel array 1210 into a digital signal. According to an example embodiment, the ADC 1240 may include a correlation double sampler (CDS) for extracting a valid signal component. The CDS may perform analog double sampling, digital double sampling, or dual correlation double sampling including both analog double sampling and digital double sampling.

The DSP 1250 may receive the digital signal output from the ADC 140 and may perform image data processing on the digital signal. The timing controller 1260 may supply control signals for controlling the RC 1230, the ADC 1240, and the DSP 1250.

The timing controller 1260 may include the fuse memory 1262 storing information relating to an operation environment of the image sensor 1200. The fuse memory 1262 may include a fuse cell array in which a plurality of fuse cells are arranged in multiple rows and multiple columns. Each fuse cell may include a read transistor connected to a read word line, a program transistor connected to a program word line, and a fuse device that is connected to a connection node between the read transistor and the program transistor and is selectively programmed.

The fuse memory 1262 may include at least one discharge circuit in each row included in the fuse cell array. The discharge circuit may turn off the program transistor connected to the program word line and, thus, may block a leakage current of the program transistor in a read mode. The fuse memory 1262 may secure a read margin with respect to data stored in the fuse cell according to whether the fuse device is programmed, thereby stably reading the data. Accordingly, the timing controller 1260 may stably perform image data processing of the image sensor 1200.

While example embodiments of the inventive concepts have been particularly shown and described with reference to some example embodiments thereof, it will be understood that various changes in form and details may be made therein without departing from the spirit and scope of the following claims.

What is claimed is:

1. A fuse memory comprising:
   a fuse cell array including fuse cells in rows and columns of the fuse cell array, each of the rows connected to a read word line and a programmed word line, and each of the columns connected to a bit line, each of the fuse cells including,
   a fuse device including a first terminal configured to receive a program voltage,
   a read transistor between a second terminal of the fuse device and the bit line of a respective one of the columns, the read transistor including a gate connected to the read word line of a respective one of the rows, and
   a program transistor between the second terminal of the fuse device and a ground voltage source, the program transistor including a gate connected to the programmed word line of the respective one of the rows; and
   at least one discharge circuit in each of the rows of the fuse cell array, the at least one discharge circuit configured to turn off the program transistor of one of the fuse cells, when the fuse cell is read.

2. The fuse memory of claim 1, wherein the fuse device is an electrical fuse (E-fuse) connected to the first terminal and the second terminal.

3. The fuse memory of claim 1, wherein the fuse device is an anti fuse connected to the first terminal and the second terminal.

4. The fuse memory of claim 1, wherein the at least one discharge circuit is an n-type metal-oxide semiconductor (NMOS) transistor connected to the program word line and the ground voltage source, the NMOS transistor including a gate connected to the read word line of the respective one of the rows.

5. The fuse memory of claim 1, wherein the at least one discharge circuit is at a center of the respective one of the rows of the fuse cell array.

6. The fuse memory of claim 1, wherein the at least one discharge circuit is at an edge of the respective one of the rows of the fuse cell array.

7. A fuse memory comprising:
a fuse cell array including,
fuse cells connected to read word lines, program word lines, and bit lines, the read word lines and the program word lines being in rows of the fuse cell array, and the bit lines being in columns of the fuse cell array, each of the fuse cells including a fuse device, and
a discharge circuit connected to the read word lines and the program word lines in each of the rows, the discharge circuit configured to discharge a voltage level of a selected one of the program word lines of the fuse cells to a ground voltage by maintaining a program transistor having a gate connected to the selected one of the program word lines in an open state, when the fuse memory is operating in a read mode;
a word line driver configured to selectively drive one of the read word lines and the program word lines of a selected one of the rows based on an operation mode; and
a sense amplifier configured to generate a sensing output signal by sensing and amplifying data output from the fuse cells to the bit lines.

8. The fuse memory of claim 7, wherein each of the fuse cells comprises:
the fuse device programmed by a program voltage, the fuse device including a first terminal configured to receive the program voltage;
a read transistor between a second terminal of the fuse device and a respective one of the bit lines, the read transistor including a gate connected to a respective one of the read word lines; and
the program transistor between the second terminal and a source of the ground voltage, the gate of the program transistor connected to a respective one of the program word lines.

9. The fuse memory of claim 8, wherein the fuse device is one of an electrical fuse (E-fuse) and an anti-fuse, the one of the E-fuse and the anti-fuse being between the first terminal and the second terminal.

10. The fuse memory of claim 7, wherein the discharge circuit is a n-type metal-oxide semiconductor (NMOS) transistor between a respective one of the program word lines and a source of the ground voltage source, the NMOS transistor including a gate connected to a respective one of the read word lines.

11. The fuse memory of claim 8, further comprising:
a voltage generator configured to apply the program voltage to the first terminal of the fuse device, when the fuse memory is operating in a program mode.

12. The fuse memory of claim 11, wherein the voltage generator is configured to apply the ground voltage to the first terminal of the fuse device, when the fuse memory is operating in the read mode.

13. The fuse memory of claim 7, wherein the sense amplifier is configured to compare a voltage level of each of the bit lines with at least one reference voltage, and to output the sensing output signal based on a result thereof.

14. The fuse memory of claim 7, wherein the discharge circuit is in a center of the rows of the fuse cell array.

15. The fuse memory of claim 7, wherein the discharge circuit is in an edge of the fuse cell array farthest from the word line driver among edges of the rows of the fuse cell array.

16. A fuse memory comprising:
at least one fuse cell including a fuse device having a first terminal and a second terminal, the first terminal connected in parallel between a read transistor and a program transistor, and the second terminal configured to receive a program voltage; and
at least one discharge circuit configured to disconnect the first terminal from a ground voltage source by maintaining the program transistor in an open state, when the fuse memory is operating in a read mode.

17. The fuse memory of claim 16, wherein the at least one discharge circuit is configured to block flow of a leakage current from the first terminal to the ground voltage source by disconnecting the first terminal from the ground voltage source.

18. The fuse memory of claim 16, wherein
the read transistor includes a gate connected to a read word line, the read word line being activated when the fuse memory is operating in the read mode,
the program transistor includes a gate connected to a program word line, and
the at least one discharge circuit includes a n-type metal-oxide semiconductor (N-MOS) transistor, the N-MOS transistor including a drain, a source and a gate, the drain of the N-MOS transistor connected to the program word line, the source of the N-MOS transistor connected to the ground voltage source, and the gate of the N-MOS transistor connected to the read word line such that the N-MOS transistor sets a voltage level of the program word line same as a voltage level of the ground voltage source, when the fuse memory is operating in the read mode.

19. The fuse memory of claim 16, further comprising:
a fuse cell array, the fuse cell array including,
a plurality of the at least one fuse cell in rows and columns of the fuse cell array, each of the rows connected to a respective read word line and a program word line, and each of the columns connected to a respective bit line, and
a plurality of the at least one discharge circuit, each of the plurality of the at least one discharge circuit associated with a respective one of the rows of the fuse cell array.

* * * * *

UNITED STATES PATENT AND TRADEMARK OFFICE
CERTIFICATE OF CORRECTION

PATENT NO. : 9,805,818 B2  
APPLICATION NO. : 15/354304  
DATED : October 31, 2017  
INVENTOR(S) : Tae-seong Kim et al.

Page 1 of 1

It is certified that error appears in the above-identified patent and that said Letters Patent is hereby corrected as shown below:

On the Title Page

Insert:  
--(30) Foreign Application Priority Data  
January 28, 2016 (KR)....10-2016-0010730--

Signed and Sealed this  
Tenth Day of July, 2018

Andrei Iancu  
*Director of the United States Patent and Trademark Office*